United States Patent [19]
Hayashi et al.

[11] Patent Number: 5,523,626
[45] Date of Patent: Jun. 4, 1996

[54] SEMICONDUCTOR DEVICE AND FABRICATION PROCESS THEREFOR

[75] Inventors: Jun Hayashi; Michiko Yamanaka, both of Tokyo, Japan

[73] Assignee: NEC Corporation, Tokyo, Japan

[21] Appl. No.: 301,621

[22] Filed: Sep. 7, 1994

[30]     Foreign Application Priority Data

Sep. 8, 1993 [JP] Japan .................................. 5-222959

[51] Int. Cl.⁶ .......................... H01L 23/48; H01L 23/52; H01L 29/40
[52] U.S. Cl. .......................... 257/763; 257/765; 257/764; 257/758
[58] Field of Search ..................... 257/763, 765, 257/764, 758, 774, 770, 771

[56]         References Cited

U.S. PATENT DOCUMENTS 3,881,971  5/1975  Greer et al. ........................ 257/771
4,618,878  10/1986 Aoyama et al. .................... 257/760
5,202,579  4/1993  Fujii et al. ........................... 257/763

FOREIGN PATENT DOCUMENTS 3-127843  5/1991  Japan .

OTHER PUBLICATIONS

1993, Spring, 40th Applied Physics United Lecture Meeting, Lecture Paper, p. 671 (Lecture No. 29p–ZY–3).

Primary Examiner—Sara W. Crane
Assistant Examiner—Jhihan Clark
Attorney, Agent, or Firm—Popham, Haik, Schnobrich & Kaufman, Ltd.

[57]         ABSTRACT

An upper wiring layer formed with a bonding pad portion has a stacked structure of a first titanium nitride film, a titanium film, a second titanium nitride film and an aluminum alloy film on the upper surface of an interlayer insulation layer. Also, the upper wiring has a stacked structure of titanium silicide film, the titanium film, the titanium nitride film and the aluminum alloy film.

5 Claims, 10 Drawing Sheets

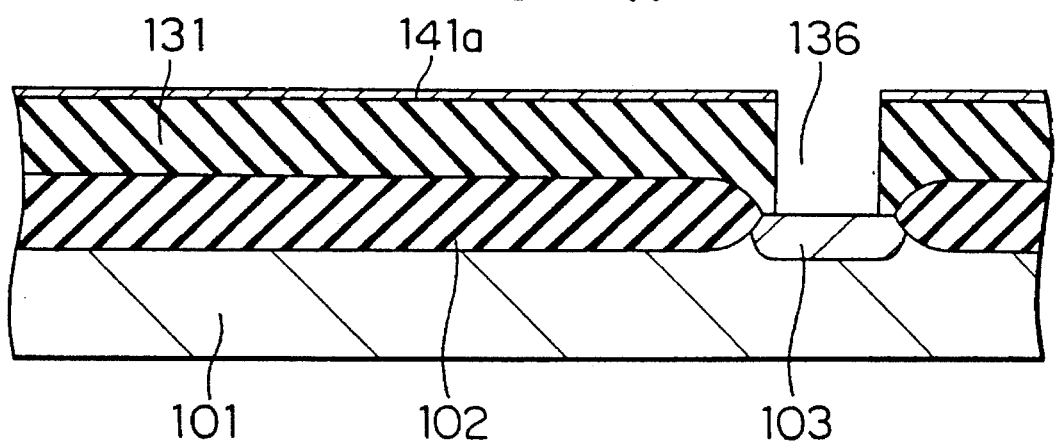
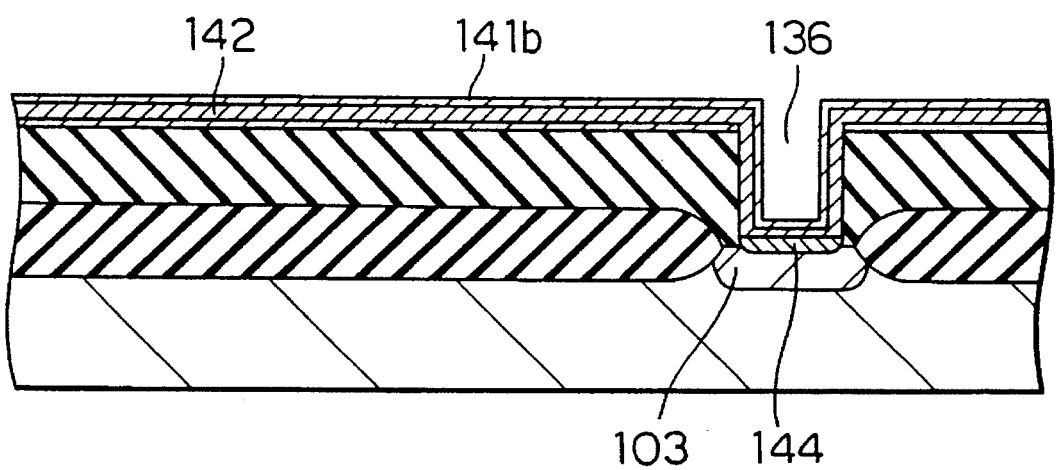
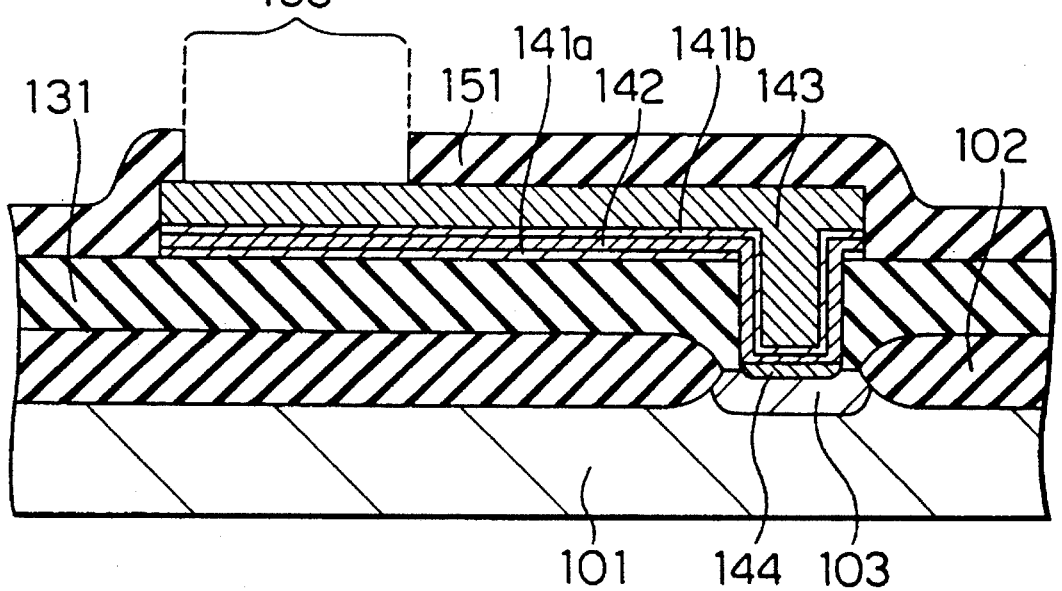

SEMICONDUCTOR DEVICE AND FABRICATION PROCESS THEREFOR

BACKGROUND OF THE INVENTION

1. Field of the Invention

The present invention relates generally to a semiconductor device and a fabrication process therefor. More specifically, the invention relates to a semiconductor device having an upper wiring layer provided with a bonding pad portion, and a fabrication process therefor.

2. Description of the Related Art

A semiconductor device fabricated on a silicon substrate includes a lower wiring layer (diffusion layer, lower layer wiring and so forth) formed in the silicon substrate surface or on the silicon substrate, an interlayer insulation layer covering the lower wiring layer, a connection hole (contact hole) formed through the interlayer insulation layer and extending to the lower wiring layer, an upper wiring layer, a surface protection layer covering the upper wiring layer and the interlayer insulation layer and a bonding pad portion including an opening formed in the surface protection layer and extending to the upper wiring layer. The semiconductor elements are formed only with the diffusion layer (in this case, the lower wiring layer is formed with only diffusion layer) or the diffusion layer and the lower wiring layer (in this case, the lower wiring layer is formed with the diffusion layer and the lower wiring layer). In the case where the lower wiring layer is formed with the diffusion layer and the lower wiring layer, a contact hole connecting the upper wiring layer and the lower wiring layer includes a contact hole connecting at least the upper and lower wiring layers. The semiconductor device is mounted in a package and electrically connected to a plurality of external lead portions of the package. A plurality of bonding pad portions provided in the upper wiring layer have a size of approximately 100 μm of length in each edge, and connected to respective external lead portions by bonding lines formed with aluminum wire or gold wire.

For realizing high package density of the semiconductor device, the wire widths of upper layer wiring and so forth are reduced. Associating therewith, in the bottom of the contact hole, a barrier layer is formed between the upper wiring layer and the lower wiring layer. This is for controlling mutual diffusion of conductive materials forming the upper wiring layer and the lower wiring layer. On the other hand, the upper layer wiring primarily formed of an aluminum or aluminum alloy is constituted of a stacked film of a film of a refractory metal or refractory metal alloy and a film of aluminum or aluminum alloy for improving stress migration strength (and electro-migration strength). In this case, the high melting metal film or the refractory metal alloy is directly in contact with the interlayer insulation layer.

In the upper wiring layer having the stacked structure as set forth above, special attention becomes necessary for connection of the bonding wire (of aluminum wire or gold wire) for connecting the external lead portions to the bonding pad portions. This is because low bonding ability between the interlayer insulation layer and the refractory metal film or refractory metal alloy film. Namely, when connection of the bonding wire is performed with applying ultrasonic vibration to the bonding pad portion, the upper wiring layer at the corresponding portion tends to be peeled off from the interlayer insulation layer. One solution for this problem is disclosed in Japanese Unexamined Patent Publication (Kokai) No. Heisei 3-127843.

FIG. 1 shows a section of a semiconductor device disclosed in the above-identified publication. As shown in FIG. 1, on the surface of a semiconductor substrate 401, a field oxide layer 402 is formed. An interlayer insulation layer covering the field oxide layer. 402 is formed with a stacked films of a BPSG film 431 directly covering the field oxide layer 402 and a TEOS oxide film 433 formed on the BPSG film 431. On this interlayer insulation layer, an upper wiring pattern or upper wiring layer is formed. The upper wiring is constituted of a stacked film of a titanium nitride film 441 directly contacting with the upper surface of the TEOS oxide film 433 and an aluminum film 443. The upper wiring is covered with a surface protective layer 451. A part of the surface protective layer 451 above the upper wiring is locally removed to define an opening to access the aluminum film 443. With the opening reaching the aluminum film 443 formed through the surface protective layer 451, bonding pad portion 456 is formed.

With the construction set forth above, upon connection of the bonding wire, peeling off of the upper wiring from the interlayer insulation layer can be successfully prevented. Also, it is discussed in the publication that, by forming the upper film portion of the interlayer insulation layer with TEOS oxide layer 433, firm fitting ability of the titanium nitride film 441 and the interlayer insulation layer can be improved.

In the semiconductor device disclosed in the above-identified publication, the problem of peeling off of the upper wiring from the interlayer insulation layer upon connection of the bonding wire to the bonding pad portion of the upper wiring, can be solved. In this case, in the bottom of the contact hole provided in the interlayer insulation layer and extending to the lower wiring layer, the titanium nitride film forming the upper wiring directly contacts with the lower layer wiring. However, in the upper wiring of the construction set forth above, a contact resistance between the upper wiring and the lower wiring connected through the contact hole becomes greater than that in the case where no titanium nitride film is present in the order to hundreds times.

As a method for suppressing increasing of the contact resistance, it has been taken a method for form the upper wiring in the construction at least including stacked film consisted of three layers of titanium film directly contacting with the upper surface of the interlayer insulation layer, the titanium nitride film and aluminum film or aluminum alloy film. In the stacked three layer structure of the upper wiring as set forth above, in the bottom of the contact hole formed in the interlayer insulation layer and extending to the lower wiring layer, the titanium film forming the upper wiring or titanium alloy film of titanium and the conductive material forming the lower wiring directly contacts, the lower wiring layer, and the titanium nitride is not directly contacted with the lower wiring layer. Therefore, increasing of the contact resistance can be limited. However, in the upper wiring including such stacked three layer structure, the problem that the upper wiring tends to peel off the interlayer insulation layer upon connection of the bonding wire to the bonding pad of the upper wiring, becomes significant.

The inventors have reported in 1993, Spring, 40th Applied Physics United Lecture Meeting, Lecture Paper, pp 671 (Lecture No. 29p-ZY-3) about a cause which makes the upper wiring to be easily peeled off the interlayer insulation layer upon connecting the bonding wire to the bonding pad portion in the upper wiring including the above-mentioned three layer structure.

Here, method of measurement of direct peeling was according to MIL specification, method 2011.4 bonding strength (destructive bond tensile test). The interlayer insulation layers were the following three kinds.

A: BPSG film formed by a low pressure CVD method (LPCVD method) with taking TEOS as one of materials;

B: silicon oxide film formed by a plasma CVD method with taking TEOS as one of materials; and C: silicon oxide film formed by a plasma CVD method with taking silane type gas and dinitrigen monoxide gas.

On the other hand, as the bonding wire, aluminum wire was employed. Also, as the bonding method, an ultrasonic bonding was employed.

With respect to samples thus obtained, rate of occurrence of peeling off was compared with the method set forth above, then, the result, A: B: C=7.1%: 0.7%: 0.0% was obtained. The peeling off occurring rate is closely associated with the load upon occurrence of peeling off in the scratch test. The inventors have attained the conclusion that practically no problem will arise if the load upon occurrence of peeling off is greater than or equal to 53 g in the scratch test.

In the additional test performed by the inventors, in the construction of the semiconductor device disclosed in the above-identified publication, when the upper wiring is provided directly on the BPSG film, namely when the interlayer insulation layer is formed with only BPSG film, the load upon occurrence of peeling off in the scratch test becomes greater than or equal to 90 g. Therefore, no problem will be arise in practical use.

FIG. 2 is a section of the semiconductor device showing the structure of the sample used in the scratch test and so forth in the foregoing report. As shown in FIG. 2, on a P-type silicon substrate 501, a field oxide layer 502 is formed. The field oxide layer 502 is covered with an interlayer insulation layer 531 having a thickness of 600 nm. The interlayer insulation layer 531 is the following three kinds similarly to the sample used for checking the peeling off occurring rate.

A: BPSG film formed by a low pressure CVD method (LPCVD method) with taking TEOS as one of materials;

B: silicon oxide film formed by a plasma CVD method with taking TEOS as one of materials; and C: silicon oxide film formed by a plasma CVD method with taking silane type gas and dinitrigen monoxide gas.

After forming the samples of the structure as set forth above, rapid thermal annealing (RTA) was performed by heating at 650° C. for 30 seconds, then scratch test was performed. Comparing the load upon occurrence of peeling off depending upon difference of the interlayer insulation layer, the result, A: B: C=4.00 g: 50.2 g: 63.8 g was obtained.

Measuring the interfaces between the titanium layers and the interlayer insulation layers 531 of the samples of the structures as set forth above by way of X-ray electron spectroscopy (XPS), the result was obtained that titanium oxide ($TiO_x$ ($x=2-\alpha$) was present, and the number of count per one second of this $TiO_x$ depends upon the composition of the interlayer insulation layer.

FIG. 3 is a graph showing a relationship between the XPS intensity of $TiO_x$ and load at occurrence of peeling off in the scratch test. As can be seen from FIG. 3, smaller amount of $TiO_x$ at the interface between the titanium film and the interlayer insulation layer 531 results in greater load at the occurrence of peeling off in the scratch test.

SUMMARY OF THE INVENTION

It is an object of the present invention to provide a semiconductor device and a fabrication process therefor, which can improve adhesion ability between the upper wiring formed with a bonding pad portions and an interlayer insulation layer as foundation of the upper wiring, and permits limiting a contact resistance between the upper wiring and the lower wiring layer at low level, by improving combination of the composition of the upper wiring and the composition of the interlayer insulation layer.

According to the first aspect of the invention, a semiconductor device comprises:

a silicon substrate having a field oxide layer which is selectively formed;

a lower wiring layer provided on at least the surface of the silicon substrate;

an interlayer insulation layer covering the silicon substrate and the lower wiring layer and having a connection hole formed at a predetermined position and extending to the lower wiring layer:

an upper wiring having a stacked structure at least including first titanium nitride film directly covering the upper surface of the interlayer insulation layer, a titanium film, a second titanium nitride film and an aluminum or aluminum alloy film, on the interlayer insulation layer, and one of a stacked structure at least including the titanium film, the second titanium nitride film and the aluminum or aluminum alloy film, a stacked structure at least including a titanium alloy film, the second titanium nitride film and the aluminum or aluminum alloy film and a stacked structure at least including the titanium alloy film, the titanium film, the second titanium nitride film and the aluminum or aluminum alloy film;

a surface protection layer covering the interlayer insulation layer and the upper wiring; and a bonding pad portion constituted of an opening provided through the surface protection layer and reaching to the upper wiring and the portion of the upper wiring exposed through the opening.

In the preferred construction, at least the upper surface of the interlayer insulation layer is formed of a silicon oxide film containing nitrogen which is not chemically coupled with silicon.

According to the second aspect of the intention, a fabrication process for a semiconductor device comprises the steps of:

forming a field oxide layer on the surface of a silicon substrate;

forming a lower wiring layer at least on the surface of the silicon substrate;

forming an interlayer insulation layer covering the silicon substrate and the lower wiring layer, and forming a first titanium nitride film covering the interlayer insulation layer;

sequentially performing etching sequentially for the first titanium nitride film and the interlayer insulation layer at a predetermined position for forming a connection hole extending to the lower wiring layer;

forming a titanium film and a second titanium nitride film in order over the entire surface and further forming at least an aluminum or aluminum alloy film over the entire surface;

performing etching at least for the aluminum or aluminum alloy film and further sequentially performing for the second titanium nitride film, the titanium film and the first titanium nitride film for forming an upper wiring; and forming a surface protection layer over the entire surface and performing etching at a predetermined position to form an opening reaching to the upper wiring.

According to the third aspect of the invention, a fabrication process for a semiconductor device comprises the steps of:

forming a field oxide layer on the surface of a silicon substrate;

forming a lower wiring layer at least on the surface of the silicon substrate;

forming an interlayer insulation layer of a silicon oxide film formed by way of plasma CVD method with materials of silane type gas and dinitrogen monoxide gas at least over the entire surface;

processing the upper surface of the interlayer insulation layer by plasma;

performing etching for the interlayer insulation layer at a predetermined position for forming a connection hole extending to the lower wiring layer;

forming a titanium film and a titanium nitride film in order over the entire surface and further forming at least an aluminum or aluminum alloy film over the entire surface;

performing etching at least for the aluminum or aluminum alloy film and further sequentially performing for the second titanium nitride film and, the titanium film for forming an upper wiring; and forming a surface protection layer over the entire surface and performing etching at a predetermined position to form an opening reaching to the upper wiring.

According to a fourth aspect of the invention, a fabrication process for a semiconductor device comprises the steps of:

forming a field oxide layer on the surface of a silicon substrate;

forming a lower wiring layer at least on the surface of the silicon substrate;

forming an interlayer insulation layer of a silicon oxide film formed by way of plasma CVD method with materials of silane type gas and dinitrogen monoxide gas at least over the entire surface;

performing etching for the interlayer insulation layer at a predetermined position for forming a connection hole extending to the lower wiring layer;

forming a titanium film and a titanium nitride film in order over the entire surface and further forming at least an aluminum or aluminum alloy film over the entire surface;

performing etching at least for the aluminum or aluminum alloy film and further sequentially performing for the second titanium nitride film and, the titanium film for forming an upper wiring; and forming a surface protection layer over the entire surface and performing etching at a predetermined position to form an opening reaching to the upper wiring.

According to the present invention, adhesion ability between the upper wiring formed with the bonding pad portion and the interlayer insulation layer as the lower layer of the upper wiring can be enhanced. Also, contact resistance between the upper wiring and the lower wiring layer can be restricted to be low enough.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIGS. 4A to 4C are section showing a sequence of steps of the first embodiment of a semiconductor device fabrication process according to the invention;

DETAILED DESCRIPTION OF THE PREFERRED EMBODIMENTS

Figure 1:
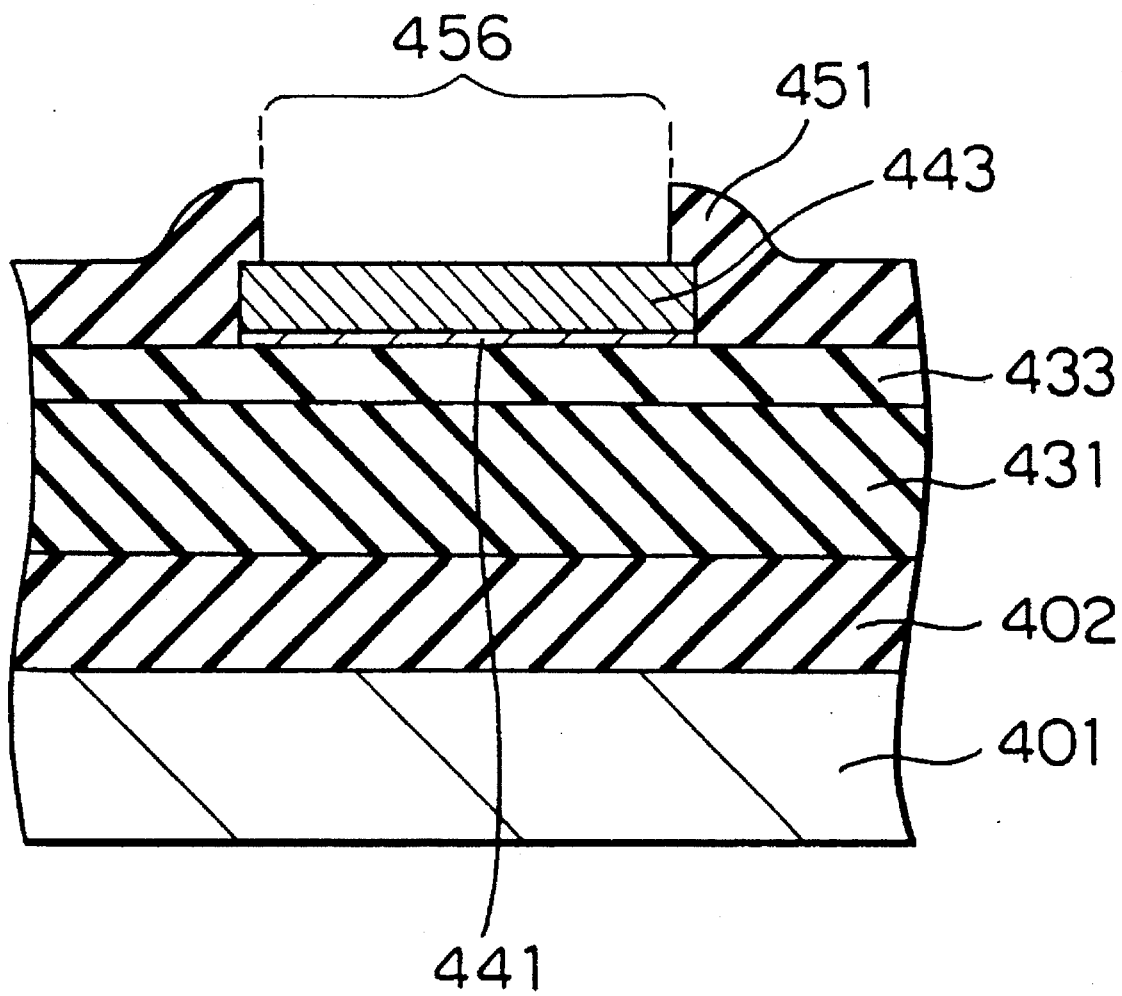
FIG. 1 is a section showing the conventional semiconductor device.
Figure 2:
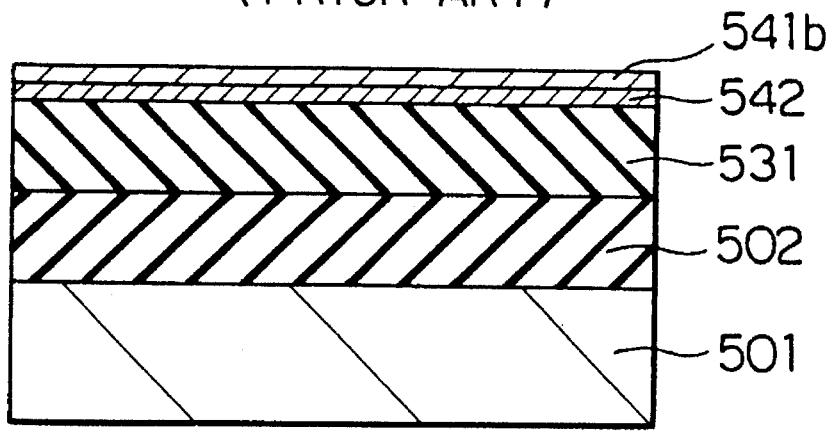
FIG. 2 is a section showing another conventional semiconductor device.

The present invention will be discussed hereinafter in detail in terms of the preferred embodiments with reference to FIGS. 4A to 12. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

FIGS. 4A to 4C are sections of a semiconductor device showing a sequence of process steps in the first embodiment of a semiconductor device fabrication process according to the present invention.

At first, as shown in FIG. 4A, a field oxide layer 102 for separating elements is selectively formed on a P-type silicon substrate 101. In a region of the silicon substrate surface not covered by the field oxide layer 102, $N^+$ type diffusion layer 103 and so forth is formed.

In the shown embodiment, the lower wiring layer is formed with the $N^+$ type diffusion layer 103. On the overall surface of this semiconductor device, a predetermined thickness of BPSG film is deposited and subject to a reflow process to form an interlayer insulation layer 131 of BPSG film. The fabrication process of the interlayer insulation layer 131 is LPCVD method with taking TEOS as one of materials, for example.

Then, by way of reactive sputtering, titanium nitride layer 141a of a thickness in the order of 50 nm, for example, is deposited over the entire surface as a first titanium nitride (TiN) film. Next, employing known photolithographic technology or reactive ion etching method (RIE), a contact hole 136 as a connection hole reaching the N⁺ type diffusion layer 103 and so forth (as the lower wiring layer) is formed.

It should be noted that the interlayer insulation layer is not necessarily the BPSG film but can be silicon oxide film, oxidized silicon nitride film, silicon nitride film or stacked film thereof.

Next, as shown in FIG. 4B, by way of sputtering or reactive sputtering, a titanium (Ti) film 142 of a thickness in the order of 30 nm, for example, and a titanium nitride film of a thickness in the order to 100 nm, as a second titanium nitride film, for example are sequentially deposited. Subsequently, alloying process is performed at a predetermined concentration. At the bottom portion of the contact hole 136, a titanium alloy film, such as titanium silicide film 144 and so forth, is formed. At this time, in the contact hole 136, whether the titanium film 142 remains or not depends on the film thickness of the titanium film upon formation of the film and conditions of the alloying process.

It should be noted that the alloying process is for reducing the contact resistance, and it will not be effected in the case where the lower wiring of aluminum type alloy film is present, for example. In this case, reduction of contact resistance should be achieved by aluminum alloying process to be performed under hydrogen atmosphere for the later formed upper wiring. In this case, the titanium silicide film is not formed at the bottom of the contact hole 136 even in the stage of aluminum alloying process.

Next, a predetermined thickness of aluminum alloy layer 143 is deposited over the entire surface. By this, the contact hole 136 is buried in the aluminum alloy layer 143. This aluminum alloy layer 143 is a aluminum based alloy layer, such as aluminum-silicon-copper alloy layer. While not shown on the drawings, it is possible to deposit a refractory metal or refractory metal alloy, such as a tungsten layer, molybdenum layer, titanium-tungsten layer over the entire surface, if required in the application.

Next, as shown in FIG. 4C, employing known photolithographic technology and RIE, aluminum alloy layer 143, the titanium nitride film 141b, the titanium film 142, the titanium nitride layer 141a are etched in order to form a desired configuration of upper wiring of the stacked films is formed.

Next, by plasma CVD method, a surface protection layer 151 of silicon oxide type insulation layer, oxidized silicon nitride layer or silicon nitride layer or stacked layer thereof is formed over the entire surface. Aluminum alloying process under hydrogen atmosphere is performed before or after the surface protection layer 151.

Subsequently, at a predetermined portion of the surface protection layer 151, an opening portion of the size having approximately 100 μm at each edge and extending to reach the aluminum alloy layer 143 of the upper wiring is formed. By this, a bonding pad portion 156 is formed with the opening portion and the upper wiring exposed through the opening. Thus, the shown embodiment of the semiconductor device is obtained.

In the first embodiment of the semiconductor fabricating process, the titanium nitride film 141a forming the part of the upper wiring is directly in contact with the upper surface of the interlayer insulation layer 131. Therefore, upon connecting a bonding wire to the bonding pad portion of the upper wiring employing ultrasonic vibration and so forth, the problem of peeling off of the upper wiring from the interlayer insulation layer 131 can be solved. Namely, the titanium nitride film 141a serves for enhancing adhesion ability between the upper wiring and the interlayer insulation layer 131. It should be noted that even in the case where the interlayer insulation layer 131 is formed with BPSG layer, the load upon occurrence of peeling off in the scratch test becomes greater than or equal to 90 g.

On the other hand, in the contact hole 136, the portion of the upper wiring directly connected to the N⁺ diffusion layer 103 as the lower wiring layer is titanium silicide layer 144. Therefore, increasing of the contact resistance can be restricted. Namely, titanium film 142 serves for reducing the contact resistance between the upper wiring and the lower wiring.

The titanium nitride film 141b as the second silicon nitride film serves as a barrier layer between aluminum as the primary material of the upper wiring and the lower wiring layer. On the other hand, the shown embodiment will not cause any problem in formation of refractory metal layer or refractory metal alloy layer on the aluminum alloy layer 143, the upper wiring having high stress migration strength can be easily obtained.

Figure 5:
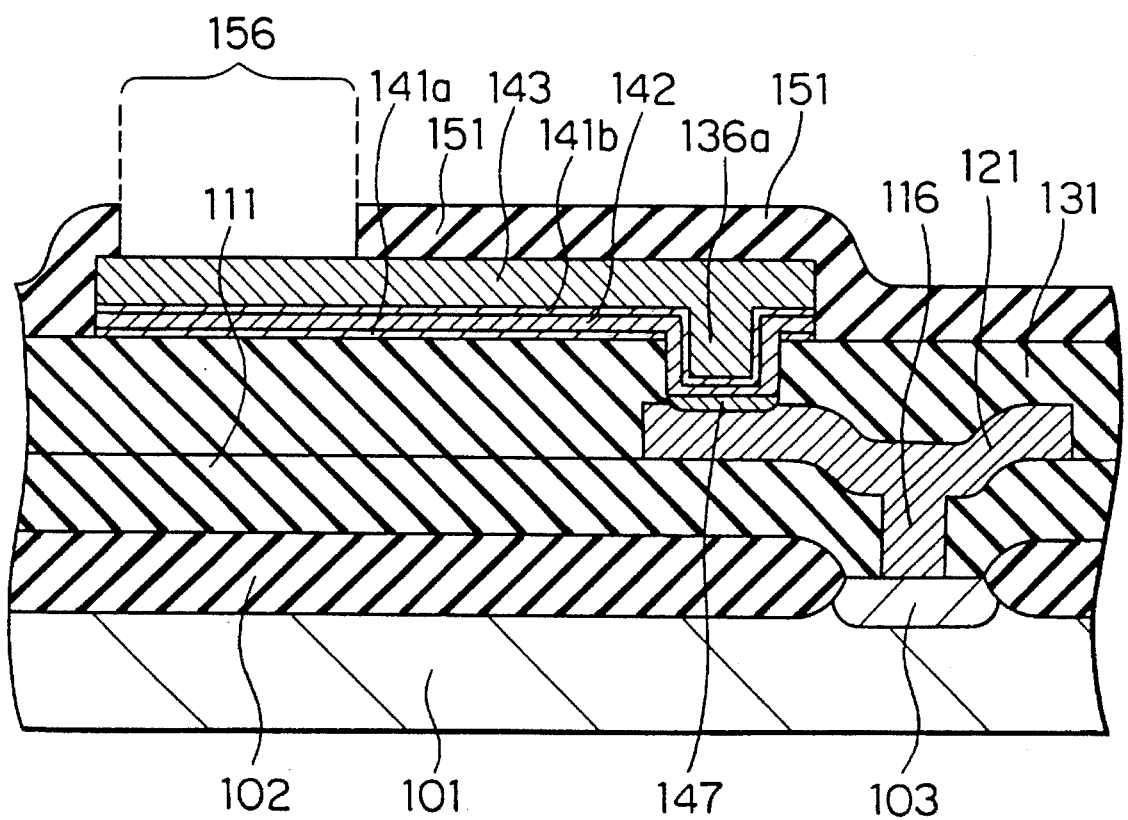
FIG. 5 is a section showing an example of application of the first embodiment.

The first embodiment of the fabrication process as set forth above is applicable for semiconductor device with multi-layer wiring. FIG. 5 shows a section of the semiconductor device with the multi-layer structure. With reference to FIG. 5, the first embodiment is applicable for the multi-layer wiring.

A P-type silicon substrate 101 provided with a field silicon oxide layer 102, N⁺ type diffusion layer 103 and so forth are covered with a first interlayer insulation layer 111 of the silicon oxide layer.

The interlayer insulation layer 111 is provided with a contact hole 116 extending to the N⁺ type diffusion layer 103 and so forth. Via the contact hole 116, a lower wiring 121 formed on the interlayer insulation layer 111 is connected to the N⁺ type diffusion layer 103 or so forth. The lower wiring 121 is formed with a polycrystalline silicon film, refractory metal film, refractory metal silicide film, refractory metal polycide film or so forth. The upper surface of the interlayer insulation layer 111 including the lower wiring 121 is covered with a second interlayer insulation layer 131 with BPSG film. In the interlayer insulation film 131, a contact hole 136a extending to the lower wiring 121 is formed. Via the contact hole 136a, the upper wiring is connected to the lower wiring 121. The structure of the upper wiring on the upper surface of the interlayer insulation layer 136a is a stacked structure of a titanium nitride film 141a, a titanium film 142, a titanium nitride film 141b and an aluminum alloy film 143 and so forth. The structure of the upper wiring to the contact hole 136a is the stacked structure of the titanium alloy film 147, the titanium film 142, the titanium nitride film 141b and the aluminum alloy film 143 and so forth.

Next, discussion will be given for another embodiment of the semiconductor device fabrication process according to the present invention. On the basis of the report made by the inventors in 1993, Spring, 40th Applied Physics United Lecture Meeting, Lecture Paper, pp 671 (Lecture No. 29p-ZY-3), the inventors have reached the following finding through subsequent study.

Figure 3:
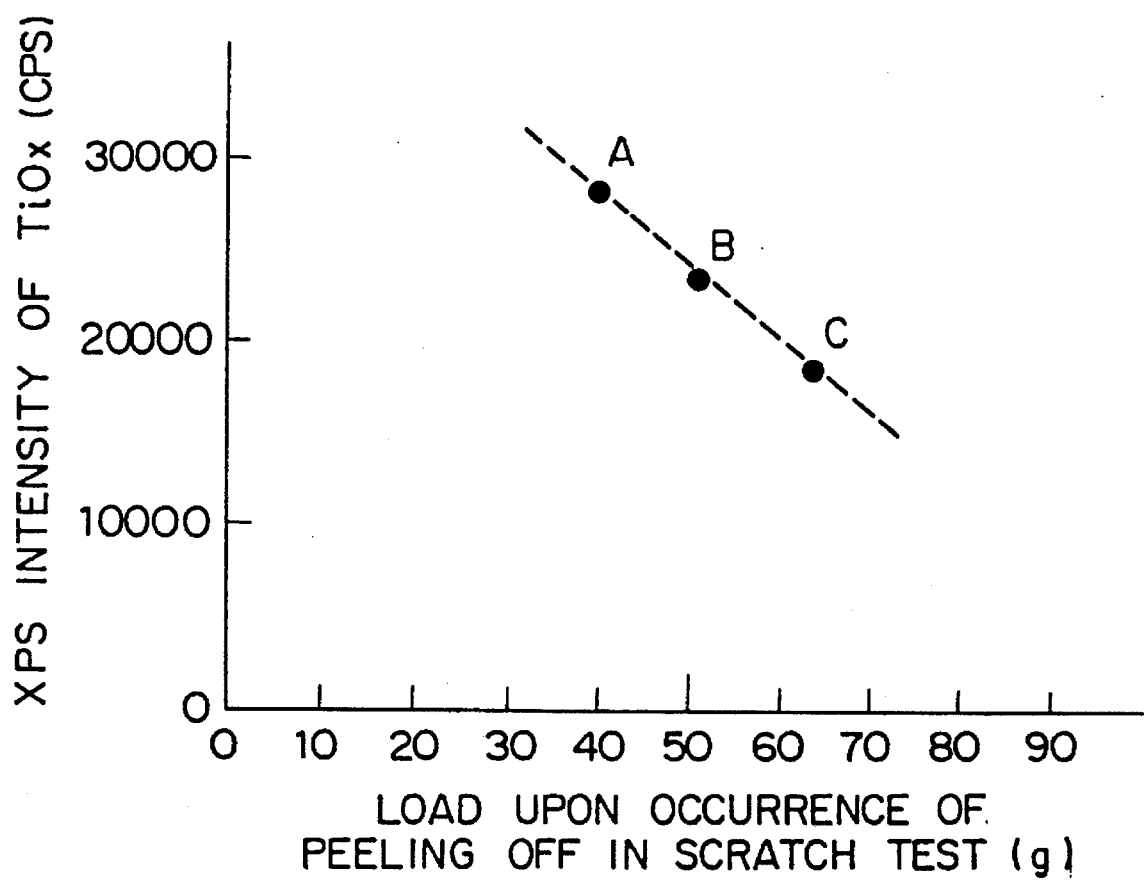
FIG. 3 is a graph illustrating the problem in the conventional semiconductor device.

In the foregoing report, attention was paid for $TiO_x$ at the interface between the three kinds of interlayer insulation layer, i.e. A: BPSG film formed by a low pressure CVD method (LPCVD method) with taking TEOS as one of materials; B: silicon oxide film formed by a plasma CVD method with taking TEOS as one of materials; and C: silicon oxide film formed by a plasma CVD method with taking silane type gas and dinitrigen monoxide gas. Results shown in FIG. 3 are data all after RTA. Variation of load upon occurrence of peeling off in the scratch test before and after RTA was not uniform. Namely, in the case where the interlayer insulation layer is A or B, the load upon occurrence of peeling off is decreased after RTA. On the other hand, only in the case where the interlayer insulation layer is C, the load upon occurrence of peeling off is increased after RYA. One of factors influencing for the load upon peeling off is amount of $TiO_x$, presence of another factor can be considered. Therefore, attention is paid for the nitrogen in the vicinity of the interface.

According to XPS, when the interlayer insulation layer is A or B, nitrogen is not present in the layer. However, in case of the interlayer insulation layer is C, nitrogen is present in the layer. Detecting nitrogen forming titanium nitride (TIN) by XPS before and after RTA, variation of amount of nitrogen forming TiN is little in the case where the interlayer insulation layer is A and B. On the other hand, in the case where the interlayer insulation layer is C, amount of nitrogen forming TiN is significantly increased after RTA. It should be noted that even in the case where the interlayer insulation layer is A or B, nitrogen forming TiN is detected in the vicinity of interface between the interlayer insulation layer and the titanium film. However, it is considered to be background due to titanium nitrogen film formed on the titanium film.

Another embodiment of the semiconductor fabrication process discussed hereinafter is based on the finding attained through detection of nitrogen by XPS and so forth.

Figure 6A:
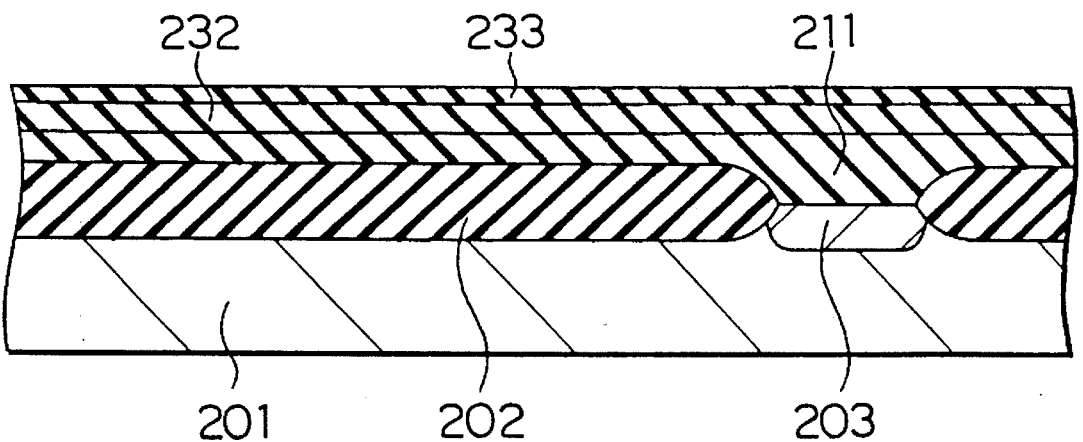
FIGS. 6A to 6C are section showing a sequence of steps of the second embodiment of a semiconductor device fabrication process according to the invention.
Figure 6B:
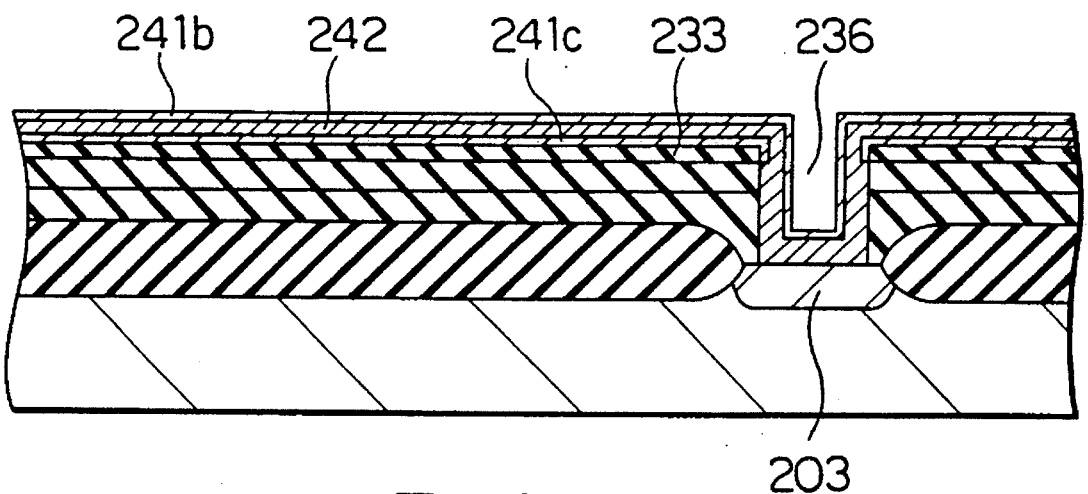
Figure 6C:
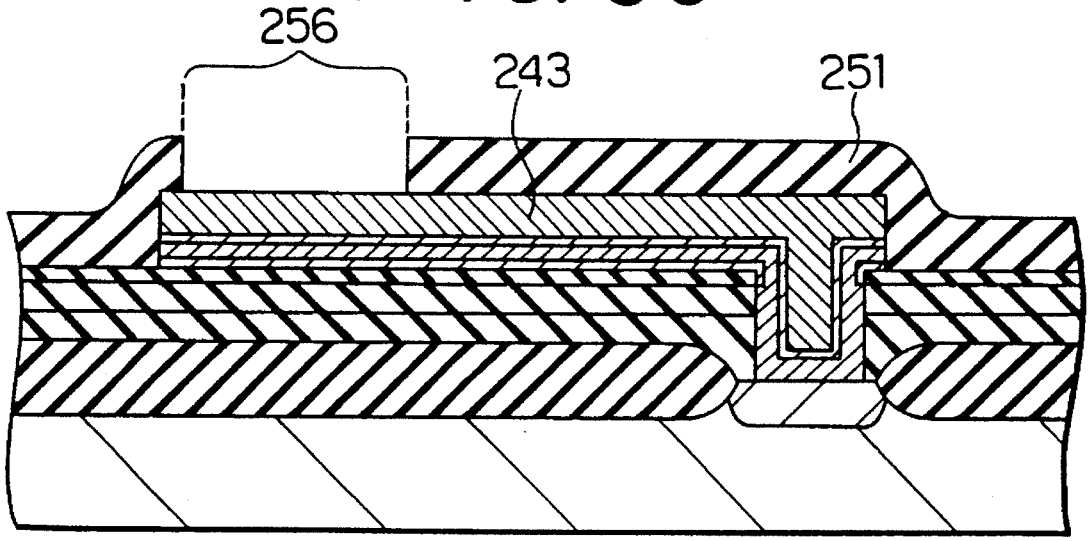

FIGS. 6A to 6C are sections showing process steps in another embodiment of the semiconductor device fabrication process according to the present invention.

At first, as shown in FIG. 6A, a field oxide layer 202 for separating elements is selectively formed on the surface of a P-type silicon substrate. Then, a predetermined thickness of BPSG film is deposited over the entire surface and subject to the reflow process to form a lower interlayer insulation layer 211 of BPSG film. By plasma CVD method at a temperature about 350° C. with taking silane gas and dinitrogen monoxide ($N_2O$) gas as materials, a predetermined thickness of nitrogen containing silicon oxide layer 232 (nitrogen content will be discussed later) as an upper interlayer insulation layer is deposited. Subsequently, with a power in the order of 500 W, plasma processing is performed under nitrogen atmosphere to form approximately 10 to 20 nm of plasma processed nitrogen layer 233 is formed on the surface of the nitrogen containing silicon oxide layer 232.

Next, as shown in FIG. 6B, the plasma processed nitrogen layer 233, the nitrogen containing silicon oxide layer 232 and the interlayer insulation layer 211 are etched sequentially to form a contact hole 236 extending to the $N^+$ diffusion layer 203. Subsequently, by sputtering and reactive sputtering, a given thickness of titanium film 242 and a given thickness of titanium nitride film 241b (finally forming the second titanium nitride film) are deposited sequentially. While these sequential sputtering, approximately 20 nm of titanium nitride film 241c is formed in the interface between the titanium film 242 and the plasma processed nitrogen layer 233. The presence of the titanium nitrogen film 241c (while discussion herein is neglected) is confirmed through the XPS. It should be noted that, in the viewpoint of structure, this titanium nitride film 241c forms the first titanium nitride film.

Subsequently, as shown in FIG. 6C, similarly to the forgoing first embodiment, a given thickness of aluminum alloy layer 243 is deposited over the entire surface. Furthermore, as required, refractory metal layer or refractory metal alloy layer may be deposited over the entire surface. Subsequently, aluminum alloy film 243, titanium nitride film 241b, the titanium film 242 and titanium nitride film 241c are etched sequentially to form a desired configuration of upper wiring of the stacked films.

Next, a surface protection layer 251 is deposited over the entire surface. Aluminum alloying process under hydrogen atmosphere is performed before or after formation of the surface protection layer. An opening of the size of approximately 100 µm in each edge and extending to the upper wiring is formed at the predetermined portion of the surface protection layer 251. By this opening and the upper wiring exposed through the opening, a bonding pad portion 256 is formed. This, the shown embodiment of the semiconductor device is obtained.

In the second embodiment set forth above, the load upon occurrence of peeling off at the stage of FIG. 6B is 63.8 g which is smaller than that of the first embodiment set forth above. However, it holds the value suitable in practical use. Also, the contact resistance can be reduced.

Figure 7:
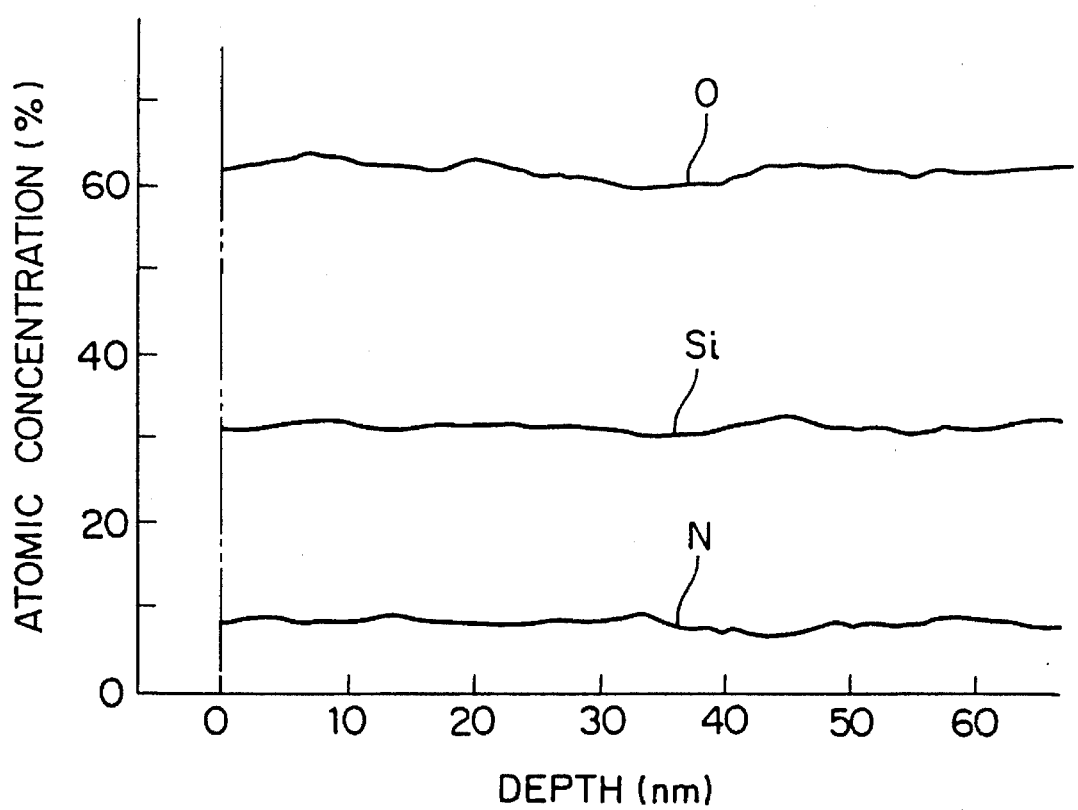
FIGS. 7 and 8 are illustration for explaining the second embodiment, in which are illustrated atom distribution in a depth direction of an interlayer insulation layer by Auger electron spectroscopy.
Figure 8:
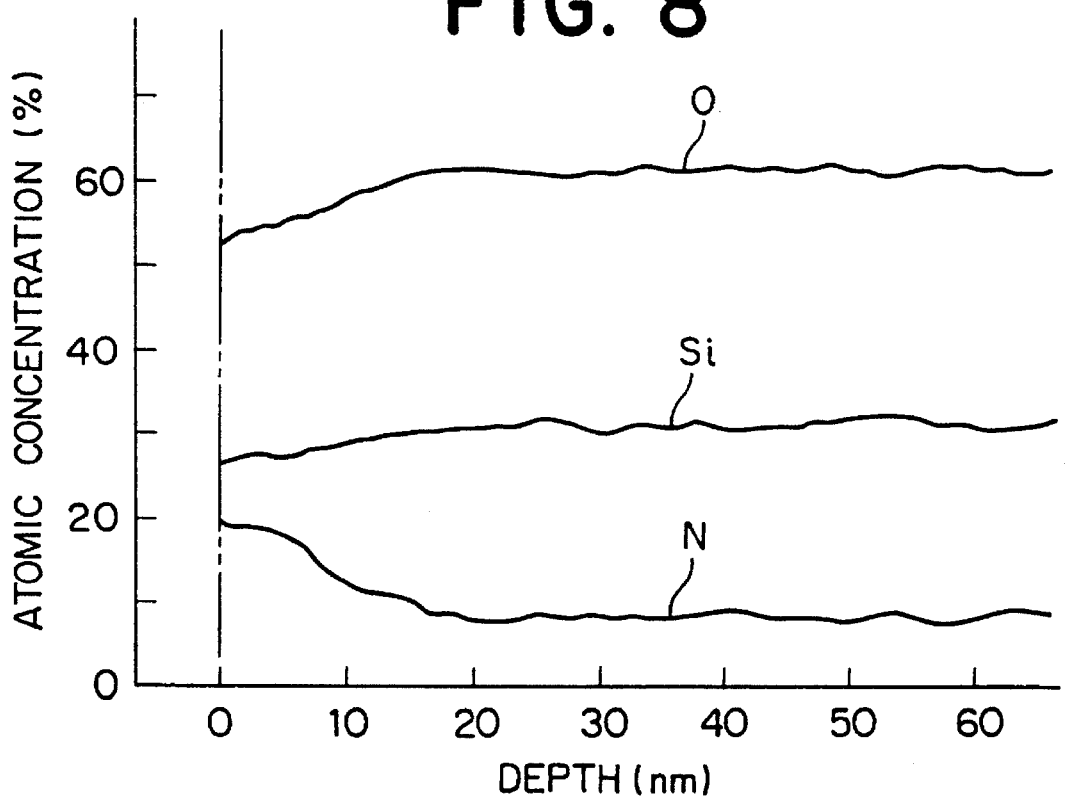

FIGS. 7 and 8 are graph showing atom distribution in a depth direction of the nitrogen containing silicon oxide layer 232 in the foregoing second embodiment, by way of Auger electron spectroscopy. From FIGS. 7 and 8, the following matters become clear.

At first, as shown in FIG. 7, the nitrogen containing silicon oxide layer 232 at the stage of formation contains a several percent of nitrogen. Next, through plasma process, as shown in FIG. 8, in the nitrogen containing silicon oxide layer 232, a layer having higher concentration of nitrogen (namely, plasma processed nitrogen layer 233) is formed in the region of approximately 10 20 nm of the surface is formed. While not illustrated on the drawings, according to XPS measurement, nitrogen present in the silicon oxide layer 232 has binding energy different from the binding energy of the nitrogen (coupled with silicon) in the silicon nitride ($Si_3N_4$). In the shown embodiment, it is considered that since a chemically active titanium film is formed on the plasma processed nitrogen layer containing a large amount of nitrogen not coupled with silicon, titanium nitride film 241c is formed. It should be noted that, through the experiments performed by the inventors, even when titanium film is formed on the insulation layer containing nitride, such as silicon nitride film, oxidized silicon nitride film or so forth, and further subject to RTA, no titanium nitride layer was formed at the interface therebetween. Namely, this implies that, for the nitrogen chemically coupled with silicon, it is difficult to establish chemical coupling even with chemically active titanium.

Figure 9:
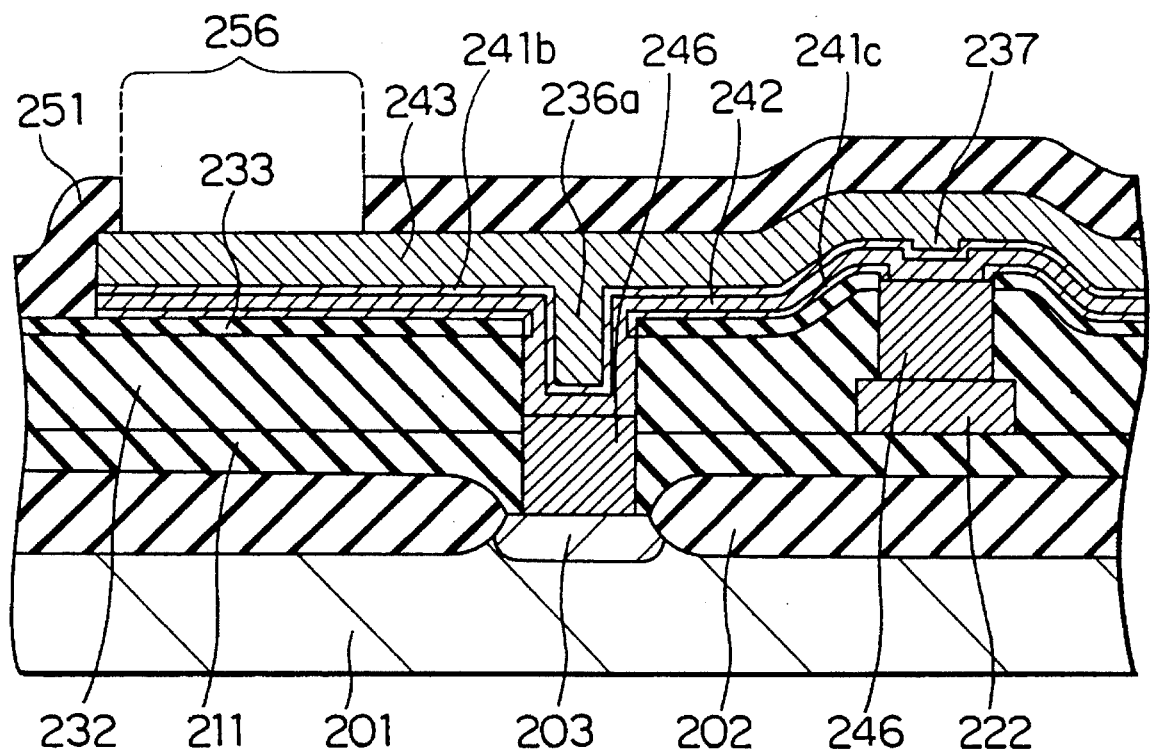
FIG. 9 is a section showing an example of application of the second embodiment of the semiconductor fabrication process.

The second embodiment of the semiconductor device fabricating process is also applicable for the semiconductor device with multi-layer wiring. An example of application of the second embodiment of semiconductor device fabrication process for the semiconductor device of the multi-layer wiring structure is illustrated in FIG. 9.

A P-type silicon substrate 201 formed with a filed oxide layer 202, $N^+$ type diffusion layer is covered with a first interlayer insulation layer 211 of BPSG film. On this interlayer insulation layer 211, a lower wiring 222 is provided. The lower wiring is formed with aluminum or aluminum alloy film, refractory metal film, refractory metal silicide film, refractory metal polycide film or so forth. The upper surface of the interlayer insulation layer 211 including the lower wiring 222 is covered with a nitrogen containing silicon oxide layer 232. On the surface of the nitrogen containing silicon oxide layer 232, a plasma processed nitrogen layer 233 is formed.

In the application of the second embodiment, there are two kinds of connection holes between the upper wiring and the lower wiring. One of the connection holes is a contact hole 236a which extends to the $N^+$ type diffusion layer 203 through the plasma processed nitrogen film 233, the nitrogen containing silicon oxide film 232 and the interlayer insulation layer 211. The other is a contact hole 237 which extends to the lower wiring 222 through the plasma processed nitrogen film 233 and the nitrogen containing silicon oxide film 232. These contact holes 236a and 237 are provided with selectively grown conductor layers 246. The selectively grown conductor layers 246 are formed of aluminum or tungsten, for example. It is possible to form conductor layers within the contact holes 236a and 237 by blanket method, in place of the selectively grown conductor layers 246. The structure of the upper wiring on the upper surface of the plasma processed nitrogen film 233 is in the stacked structure of titanium nitride film 241a, titanium film 242, titanium nitride film 241b and aluminum alloy film 243, similarly to the foregoing second embodiment. Similarly, the structure of the upper wiring on the upper surface of the selectively grown conductor layer 246 is the stacked structure of titanium film 242, titanium nitride film 241b and the aluminum alloy film 243.

In the example of application of the first embodiment, it is difficult to bury the conductor layer even by employing the multi-layer wiring since the titanium nitride film 141a is present. For this reason, it has avoided to form the connecting hole directly connecting the upper wiring and lowermost lower wiring ($N^+$ type diffusion layer). Therefore, large occupied area has been required for direct connection between the upper wiring and the lower most lower wiring. In comparison to this, in the application of the second embodiment as set forth above, since it is facilitated to form the selectively grown conductor layers within the contact holes 236a and 237, it becomes possible to directly connect the upper wiring and the lower wiring ($N^+$ type diffusion layer). Therefore, this application is successful in avoiding increasing of the occupied area of the connection holes in employing of the multi-layer wiring and thus effective for achieving down-sizing and increasing of package density of the semiconductor device.

Figure 10A:
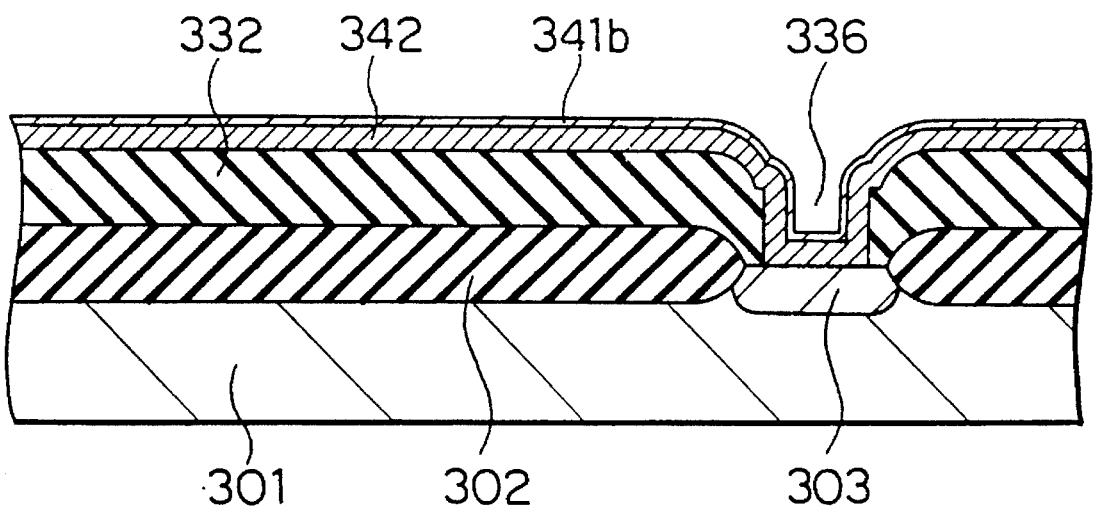
FIGS. 10A to 10C are sections showing a sequence of steps of the third embodiment of a semiconductor device fabrication process according to the invention.
Figure 10B:
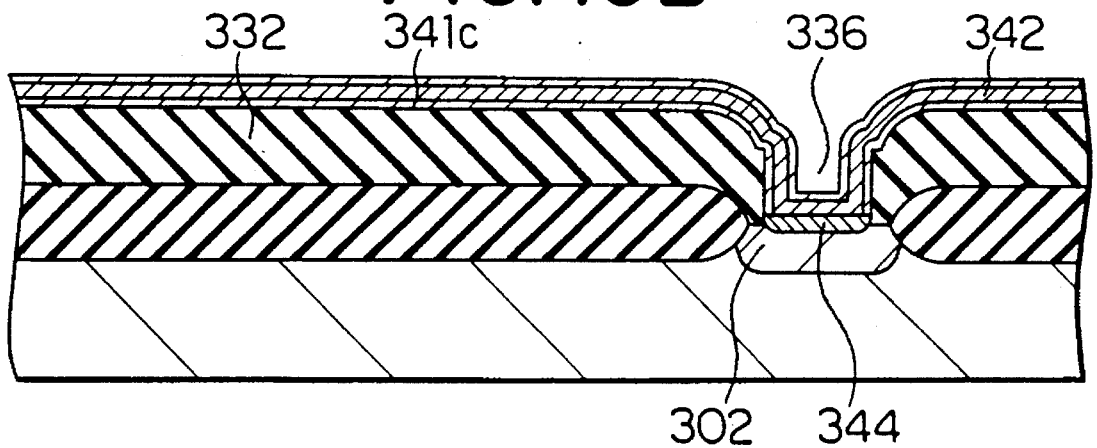
Figure 10C:
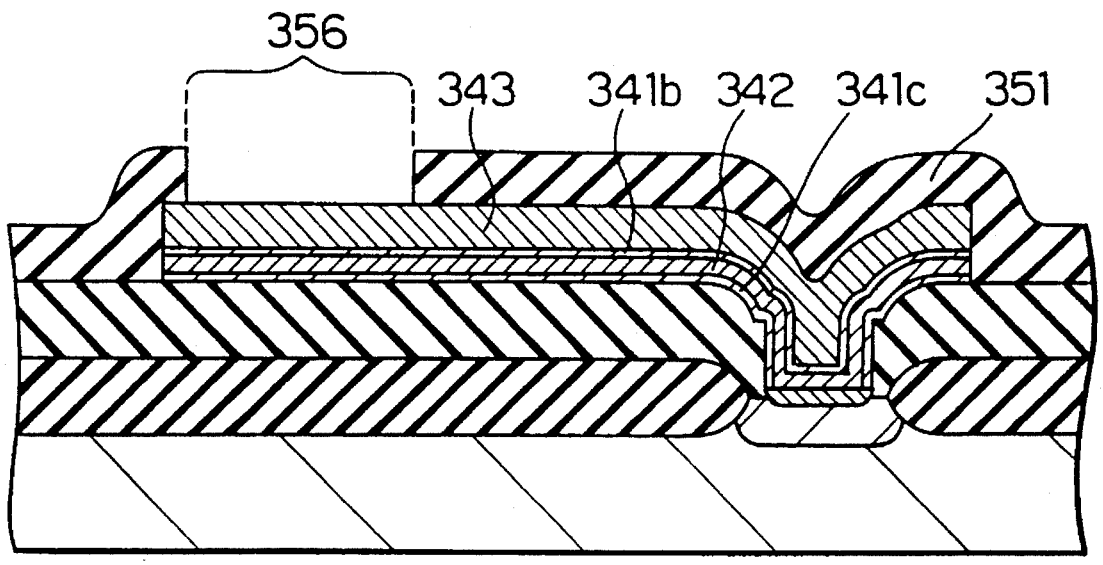

FIGS. 10A to 10C are sections showing the third embodiment of the semiconductor device fabrication process according to the invention.

At first, as shown in FIG. 10A, a field oxide layer 302 for separating elements is selectively formed on the surface of the P-type silicon substrate 301. Also, $N^+$ type diffusion layer 303 is formed. By plasma CVD method with silane gas and dinitrogen monoxide as materials, a given thickness of nitrogen containing silicon oxide layer 332 is deposited over the entire surface.

Next, the predetermined portion of the nitrogen containing silicon oxide layer 332 is etched to define the contact hole 336 reaching the $N^+$ type diffusion layer 303. Then, by way of sputtering and reactive sputtering, a given thickness of titanium film 342 and a given thickness of titanium nitride film 341b (finally forms the second titanium nitride film) are sequentially deposited over the entire surface.

It should be noted that, in the shown embodiment, different from the foregoing second embodiment, titanium nitride film is not clearly detected at the interface between the nitrogen containing silicon oxide film 332 and the titanium film 342, at this stage. This is considered to depend upon the content of nitrogen in the nitrogen containing silicon oxide layer 332. Also, at this stage, the load upon occurrence of peeling off in the scratch test is approximately 50.6 g.

Next, as shown in FIG. 10B, RTA is performed under nitrogen atmosphere at 650° C. for 30 seconds. By this at the interface between the nitrogen containing silicon oxide film 332 and the titanium film 342 (including the side wall of the contact hole 336, approximately 30 nm thick of titanium nitride film 341c is formed (discussed in detail later). In the structure of the semiconductor device, this titanium nitride film 341c becomes the first titanium nitride film. On the other hand, at the interface between the $N^+$ type diffusion layer 303 and the titanium film 342 in the bottom of the contact hole 336, a titanium silicide layer 344 is formed.

Subsequently, as shown in FIG. 10C, a given thickness of aluminum alloy layer 343 is deposited over the entire surface, similarly to the foregoing first and second embodiments. Furthermore, if required, refractory metal film or refractory metal alloy film may be formed for covering the aluminum alloy layer 343.

Then, the aluminum alloy layer 343, the titanium nitride film 341a, the titanium film 342 and the titanium nitride film 341c are etched in order to form the desired configuration of the upper wiring. Then, the surface protection layer 351 is deposited over the entire surface. Aluminum alloying process under hydrogen atmosphere is performed before or after formation of the surface protection layer 351. Subsequently, in the predetermined portion of the surface protection layer 251, an opening in the side of approximately 100 μm in each edge and extending to the upper wiring is formed. The opening and the upper wiring exposed through the opening, a bonding pad 356 is formed to attain the shown embodiment of the semiconductor device.

The load value upon occurrence of peeling off in the scratch test at the stage of FIG. 10B is 63.8 g which is greater than that of the second embodiment whole the fabrication process is simpler than the second embodiment. This value is also smaller than that of the first embodiment but holds practical applicability. Also, the contact resistance can be reduced. It should be noted that after depositing the nitrogen containing silicon oxide 332, plasma process under nitrogen atmosphere may be performed.

Figure 11:
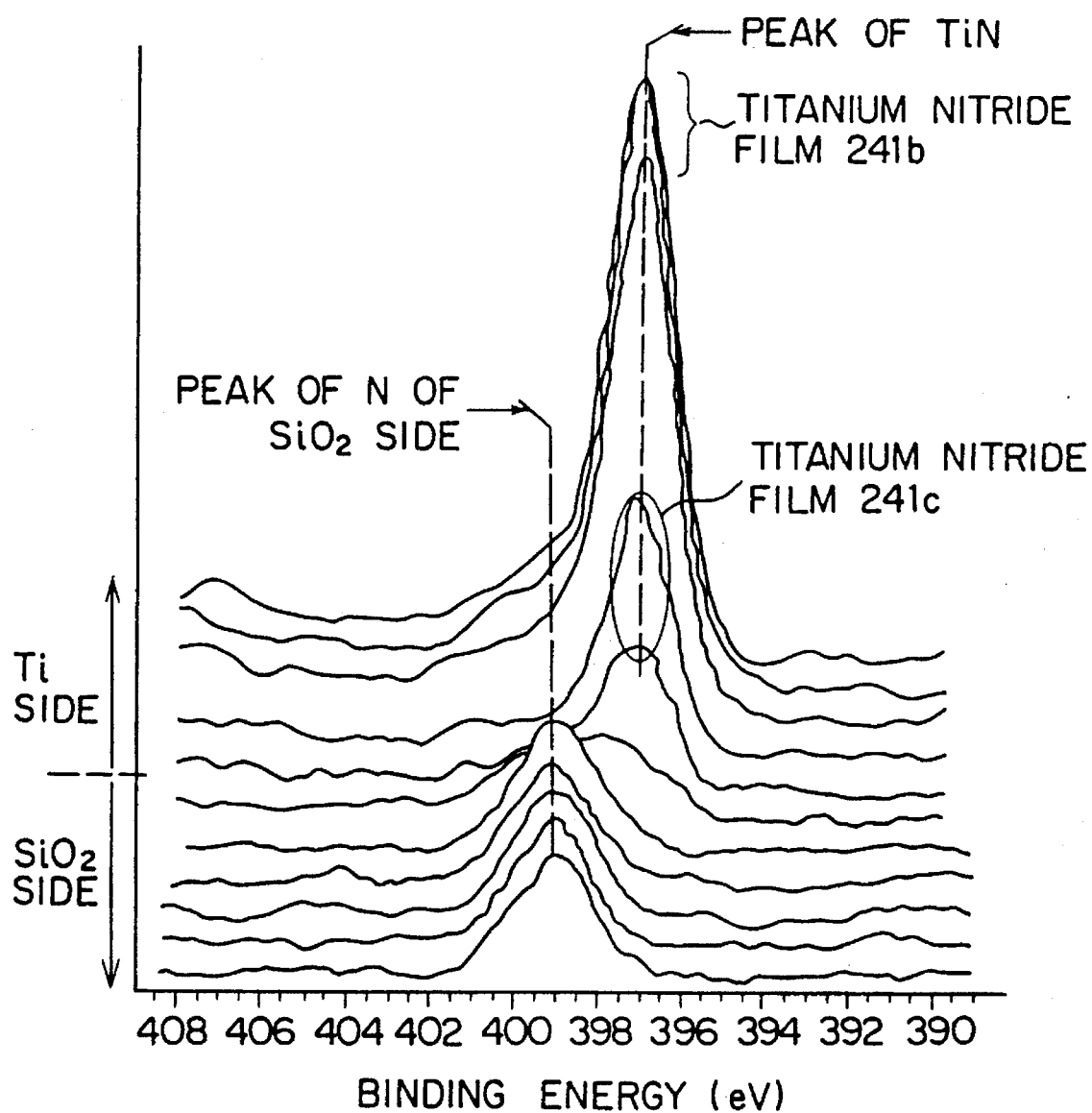
FIG. 11 is an illustration for explaining the third embodiment, in which is shown a graph showing energy-spectrum distribution of nitrogen by XPS.

FIG. 11 is a graph showing an energy spectrum distribution of nitrogen measured by XPS. As can be seen from FIG. 11, in the stage of FIG. 10B of the third embodiment, it becomes clear that the titanium nitride film is formed. Presence of nitrogen having approximately 367 eV of binding energy clearly indicates presence of the titanium nitrogen. Peak of this value is separated into two. One peak is the peak of the originally present titanium nitride film 341b. The presence of the other peak is evident that the titanium nitride 341c is newly formed from the titanium film 242 and the nitrogen containing silicon oxide film 332. It should be noted that nitrogen in the nitrogen containing silicon oxide and having approximately 399 eV of binding energy is not the nitrogen coupled with silicon.

Figure 12:
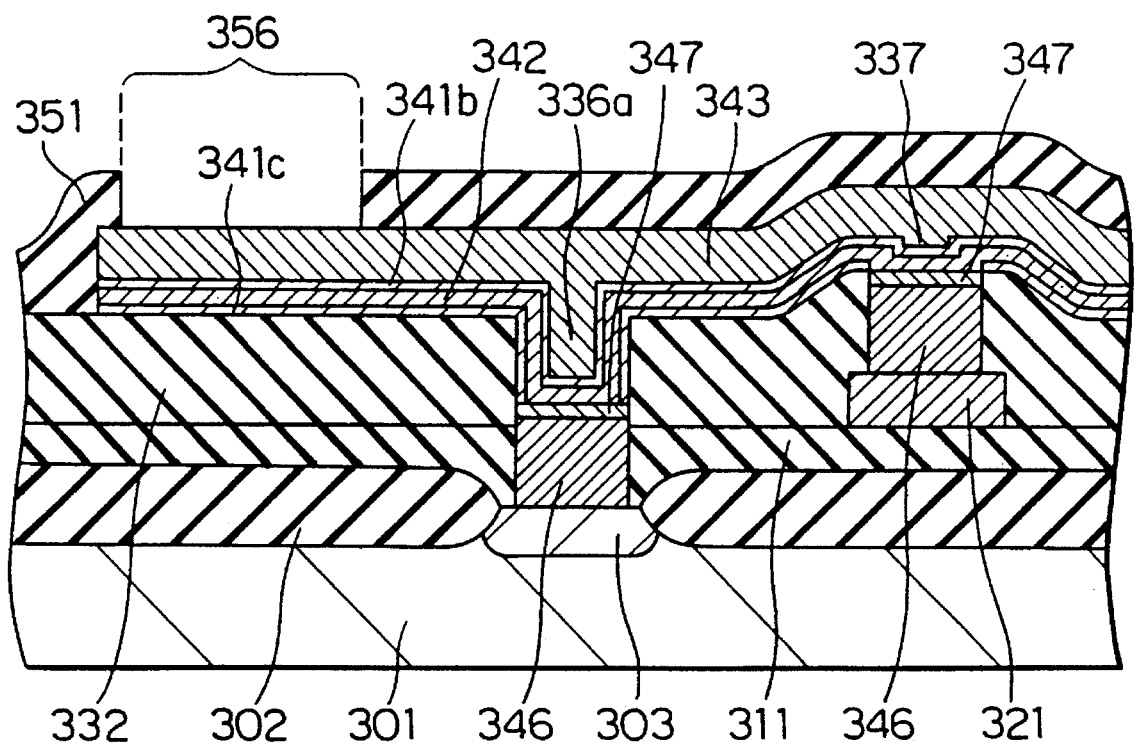
FIG. 12 is a section showing an example of application of the third embodiment of the semiconductor fabrication process.

The third embodiment of the fabrication process as set forth above may also be applicable for semiconductor device with multi-layer wiring. FIG. 12 shows an example of application of the third embodiment of the semiconductor device fabrication process for the multi-layer structure.

The P-type silicon substrate 301 formed with the field oxide layer 302, $N^+$ diffusion layer and so forth is covered with the first interlayer insulation layer 311 of BPSG film. On the first interlayer insulation layer 311, the lower wiring 321 is formed. The lower wiring is formed with a polycrystalline silicon film, refractory metal film, refractory metal silicide film, high melting point polycide film and so forth. The upper surface of the interlayer insulation layer 311 including the lower wiring 321 is covered with the nitrogen containing silicon oxide film 332.

Even in the application of the third embodiment, there are two connection holes between the upper wiring and the lower wiring layer. One is contact hole 336a which reaches the $N^+$ diffusion layer 303 via the nitrogen containing silicon oxide film 332 and the interlayer insulation layer 311. The other is the contact hole 337 extending to the lower wiring 321 through the nitrogen containing silicon oxide film 332. For these contact holes 336a and 337, predetermined length of selectively grown conductor layers 346 are provided, respectively. The selectively grown conductor layer 346 is formed of a tungsten, polycrystalline silicon and so forth. In place of the selectively grown conductor layer 346, the conductor film may be formed within the contact holes 336a and 337 by way of blanket method and so forth. The structure of the upper wiring on the upper surface of the nitrogen containing silicon film 332 is the stacked films of titanium nitride film 341c, titanium film 342, titanium nitride film 341b and alloy film 343. On the other hand, the structure of the upper wiring on the selectively grown conductor layer 346 is the stacked films of titanium alloy film 347, titanium film 342, titanium nitride film 341b and alloy film 343. Similarly to the foregoing application example of the second embodiment, the application example of the third embodiment is successful in avoiding increasing of the occupied area of the connection holes in employing of the multi-layer wiring and thus effective for achieving down-sizing and increasing of package density of the semiconductor device.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor device comprising:
   a silicon substrate having a field oxide layer which is selectively formed;
   a lower wiring layer provided on at least the surface of said silicon substrate;
   an interlayer insulation layer covering said silicon substrate and said lower wiring layer and having a connection hole formed at a predetermined position and extending to said lower wiring layer;
   an upper wiring having a stacked structure at least including a first titanium nitride film directly covering the upper surface of said interlayer insulation layer, a titanium film, a second titanium nitride film and an aluminum or aluminum alloy film, on said interlayer insulation layer,
   a surface protection layer covering said interlayer insulation layer and said upper wiring; and
   a bonding pad portion constituted of an opening provided through said surface protection layer and reaching to said upper wiring and the portion of said upper wiring exposed through said opening.

2. A semiconductor device as set forth in claim 1, wherein at least the upper surface of said interlayer insulation layer is formed of a silicon oxide film containing nitrogen which is not chemically coupled with silicon.

3. The semiconductor device of claim 1 comprising a stacked structure in said connection hole, said stacked structure comprising said titanium or a titanium alloy film directly contacting the upper surface of said lower wiring layer, said second titanium nitride film, and said aluminum or aluminum alloy film.

4. The semiconductor device of claim 3 wherein said stacked structure in said connection hole comprises a titanium silicide film directly contacting the upper surface of said lower wiring layer, said titanium film, said second titanium film and said aluminum or aluminum alloy film.

5. A semiconductor device comprising
   a semiconductor substrate;
   a first insulating film covering said semiconductor substrate;
   a first hole selectively formed in said first insulating film to expose at least one of a part of a diffusion region which is selectively formed in said semiconductor substrate and a part of a wiring layer which is buried in said first insulating film;
   a conductor layer formed on said first insulating film in contact with said at least one of said part of said diffusion region and said part of said wiring layer through said first hole, said conductor layer being composed of a conductive layer and a titanium nitride layer selectively formed under said conductive layer, said conductor layer having a first portion composed of said titanium nitride layer formed on said first insulating film in direct contact therewith and a part of said conductive layer formed on said titanium nitride layer and a second portion composed of another part of said conductive layer formed in contact with said at least one of said part of said diffusion region and said part of said wiring layer without intervention of said titanium nitride layer;
   a second insulating film formed to cover said conductor layer, and
   a second hole selectively formed in said second insulating film to expose a part of said first portion of said conductor layer, said part of said first portion defining a bonding pad portion.

* * * * *